United States Patent [19]
Yun et al.

[11] Patent Number: 6,064,265
[45] Date of Patent: May 16, 2000

[54] GAIN CONTROL CIRCUIT FOR LOW-NOISE AMPLIFIER

[75] Inventors: Kwang Jun Yun; Min Kun Kim; Chang Seok Lee; Jae Jin Lee; Kwang Eui Pyun, all of Daejon-Shi, Rep. of Korea

[73] Assignee: Electronics and Telecommunications Research Institute, Daejon-shi, Rep. of Korea

[21] Appl. No.: 09/146,529

[22] Filed: Sep. 3, 1998

[30] Foreign Application Priority Data

Dec. 24, 1997 [KR] Rep. of Korea ...................... 97-73712

[51] Int. Cl.[7] ....................................... H03G 3/10
[52] U.S. Cl. ............................... 330/279; 330/282
[58] Field of Search ...................... 330/279, 282, 330/284, 302, 310, 311, 85, 86

[56] References Cited

U.S. PATENT DOCUMENTS

| | | | |
|---|---|---|---|
| 4,348,643 | 9/1982 | Tennyson | 330/294 |
| 5,408,198 | 4/1995 | Kusunoki | 330/277 |
| 5,532,646 | 7/1996 | Aihara | 330/279 |
| 5,742,206 | 4/1998 | Ishida | 330/284 |

FOREIGN PATENT DOCUMENTS 0 561346A1  9/1993  European Pat. Off. .

*Primary Examiner*—Benny Lee
*Assistant Examiner*—Henry Choe
*Attorney, Agent, or Firm*—Jacobson, Price, Holman & Stern, PLLC

[57] ABSTRACT

The present invention relates to a gain control circuit for a low-noise amplifier. A gain control circuit of a 2-stage low-noise amplifier comprising an input stage noise matching circuit, an intermediate impedance matching circuit, a gain control circuit, and an output stage impedance matching circuit, said gain control circuit including: a feedback circuit connected to a transistor of second stage of the 2-stage low-noise amplifier, said feedback circuit detecting the amplified signal through the first stage and the second stage, and feeding the signal back through a switch circuit; and an attenuation circuit for compensating the harmonics of the input signal.

1 Claim, 3 Drawing Sheets

GAIN CONTROL CIRCUIT FOR LOW-NOISE AMPLIFIER

BACKGROUND OF THE INVENTION

1. Field of the Invention

The present invention relates to a gain control circuit for a low-noise amplifier, specifically to a gain control circuit for a low-noise amplifier which can maintain linearity under input signal variations.

2. Description of the Related Art

In cellular mobile communication systems such as portable telephone systems, the strength of the signal varies depending on the distance between the cell site and the mobile phone, and also depending on the environment, hence a gain control circuit is required to overcome these factors. That is, if the input signal strength to the mobile phone becomes greater, a receiver circuit which comprises a low-noise amplifier, a mixer and an intermediate frequency amplifier becomes saturated, resulting the abrupt deterioration of linearity. Thus, a circuit which can reduce gain is required to prevent such deterioration of linearity. Also, as the signal strength becomes higher, linearity of the circuit deteriorates abruptly. Therefore, the gain control circuit which can improve linearity when a high strength signal is input is indispensable.

In the conventional gain control circuit, when a high strength signal is input, the gain control circuit attenuates the signal simply by a gain control voltage to decrease gain. Such gain control circuits can control gain by signal attenuation, but since they do not compensate harmonics they cannot improve the linearity of the low-noise amplifier.

FIG. 1 is a block diagram of the prior art low-noise amplifier having a gain control feature.

In a conventional low-noise amplifier, impedance matching is done at the input stage for noise matching. For this, a noise matching circuit 11 is provided at the input stage, and impedance matching circuits 12 and 13 are provided at the intermediate and output stages. A gain control circuit 14 is provided at the intermediate stage in order not to affect the noise and impedance matching at the input and output stages. When high strength signal is input, the gain control circuit attenuates the signal simply by a gain control voltage to reduce gain. In this case, gain control is possible by the signal attenuation, but since no compensation of harmonics exists, the linearity of the low-noise amplifier is not improved.

In general, the linearity of an amplifier becomes abruptly deteriorated when the circuit starts to be saturated by a high input signal. When two signals having identical signal strength and slightly different frequencies are applied, harmonics and intermodulation components are generated due to the non-linearity of the low-noise amplifier.

FIGS. 2a and 2b are graphs showing the input and output power characteristics of the harmonics spectrum and intermodulation components due to the non-linearity of the signal. Here, $2w_1$, $2w_2$, $3w_1$, $3w_2$ denote harmonics and $w_2-w_1$, $2w_1-w_2$, $2w_2-w_1$, $w_1+w_2$, $2w_1+w_2$, $2w_2+w_1$ denote intermodulaton components. We define $IMD_3$ as the power difference between the basic component and the 3rd-order intermodulation component $2w_1-w_2$ or $2w_2-w_1$. Also, we define $IP_3$ as the power which can be acquired by extrapolating the power of the basic component and the power of the 3rd-order intermodulation component. These two factors are used as measures of the linearity.

The 3rd-order intermodulation component is important for the linearity, because the 3rd-order intermodulation component is located in close proximity to the basic component so that it is difficult to remove it even with filters having very good selectivity, causing interference with the basic component.

When the low-noise amplifier is not at the fully saturated area and has weak distortion, it is possible to predict the linearity using Volterra series as shown in Equation 1.

Equation 1

$$IMD_3 = 20\log\frac{3}{4}V_S^2\left|\frac{Y_S(\omega)}{Y_i(\omega)}\right|^2\left|\left(\frac{g_{m3}}{g_{m1}}\right) + \frac{1}{Y_0(\omega)}\left(\frac{\frac{4}{3}g_{02}g_{m2}}{Y_0(\omega)} + \frac{g_{m1}^2}{|Y_0(\omega)|^2}\left(\frac{\frac{4}{3}g_{o2}^2}{Y_0(\omega_d)}g_{03}\right)\right) + \frac{2j\omega c_{G2}}{3Y_i(2\omega)}\left(\frac{2j\omega c_{G2}}{3Y_i(2\omega)} - \frac{2g_{m2}}{g_{m1}}\right) - \left(\frac{j\omega c_{G3}}{Y_i(\omega)}\right) + \frac{\frac{2}{3}g_{02}}{Y_0(2\omega)Y_0^+(\omega)}\left(\frac{-g_{m1}2j\omega c_{G2}}{Y_i(2\omega)} + g_{m2} + \frac{g_{02}g_{m1}^2}{Y_0^2(\omega)}\right)\right|$$

Here, $wd=w_1-w_2$. From equation 1, it can be noticed that $IMD_3$ characteristics of the low-noise amplifier has a close relation with the magnitude of the harmonics. Hence, a compensation circuit for the harmonics is required to improve the linearity.

SUMMARY OF THE INVENTION

It is an object of the present invention to provide a gain control circuit of a low-noise amplifier which can improve linearity by increasing gain when the strength of the incoming signal is low, and by decreasing gain when the strength of the input signal is high.

The gain control circuit of the low-noise amplifier according to the present invention is characterized that, in a 2-stage low-noise amplifier comprising an input stage noise matching circuit, an intermediate impedance matching circuit, a gain control circuit, and an output stage impedance matching circuit, the gain control circuit includes a feedback circuit connected to a transistor of second stage of the 2-stage low-noise amplifier, for detecting the amplified signal through the first stage and the second stage and feeding the signal back through a switch circuit, and an attenuation circuit for compensating the harmonics of the input signal.

BRIEF DESCRIPTION OF THE DRAWINGS

The objects, features and advantages of the present invention will be apparent to one skilled in the art from the following detailed description in conjunction with the accompanying drawings, in which.

DETAILED DESCRIPTION OF THE INVENTION

Now, detailed description of the present invention follows referring to the attached figures.

Figure 1:
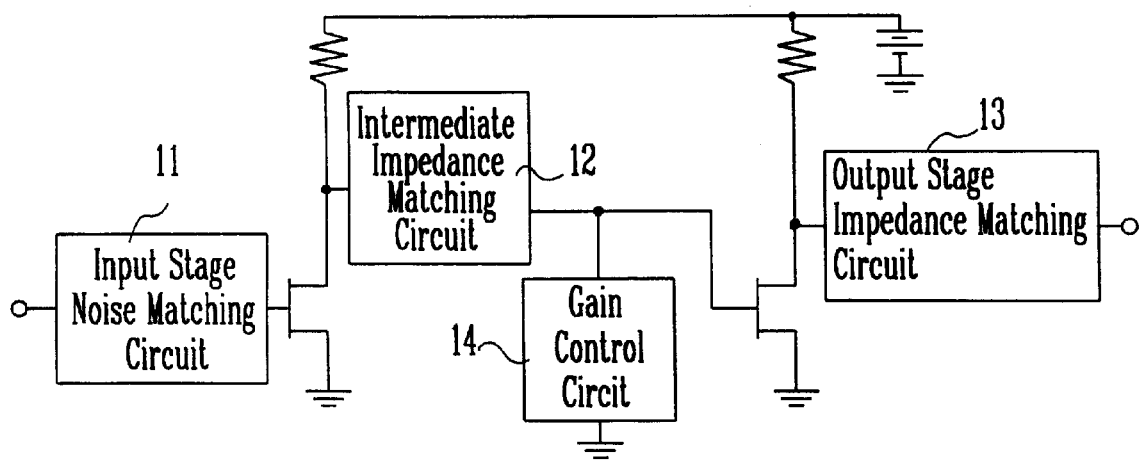
FIG. 1 is a block diagram of the prior art low-noise amplifier having a gain control feature.
Figure 2A:
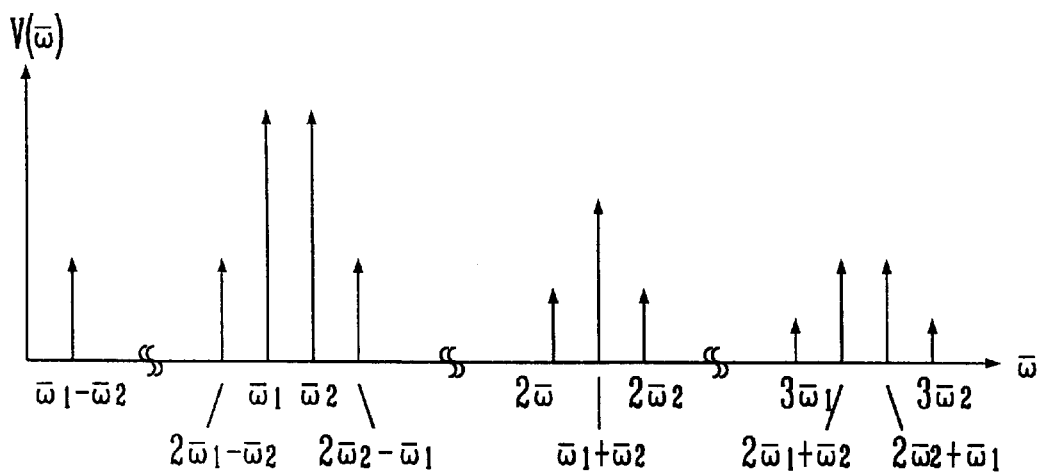
FIGS. 2a and 2b are graphs showing the input and output power characteristics of the harmonics spectrum and intermodulation components due to the non-linearity of the signal.
Figure 2B:
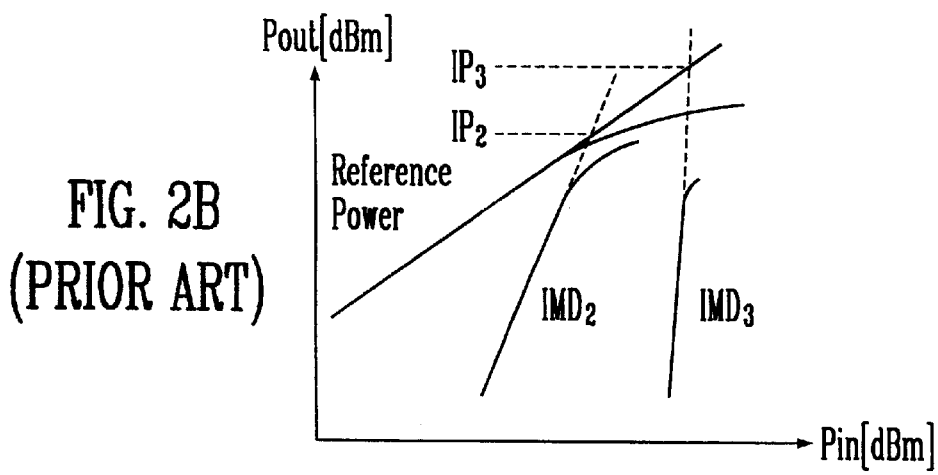
Figure 3:
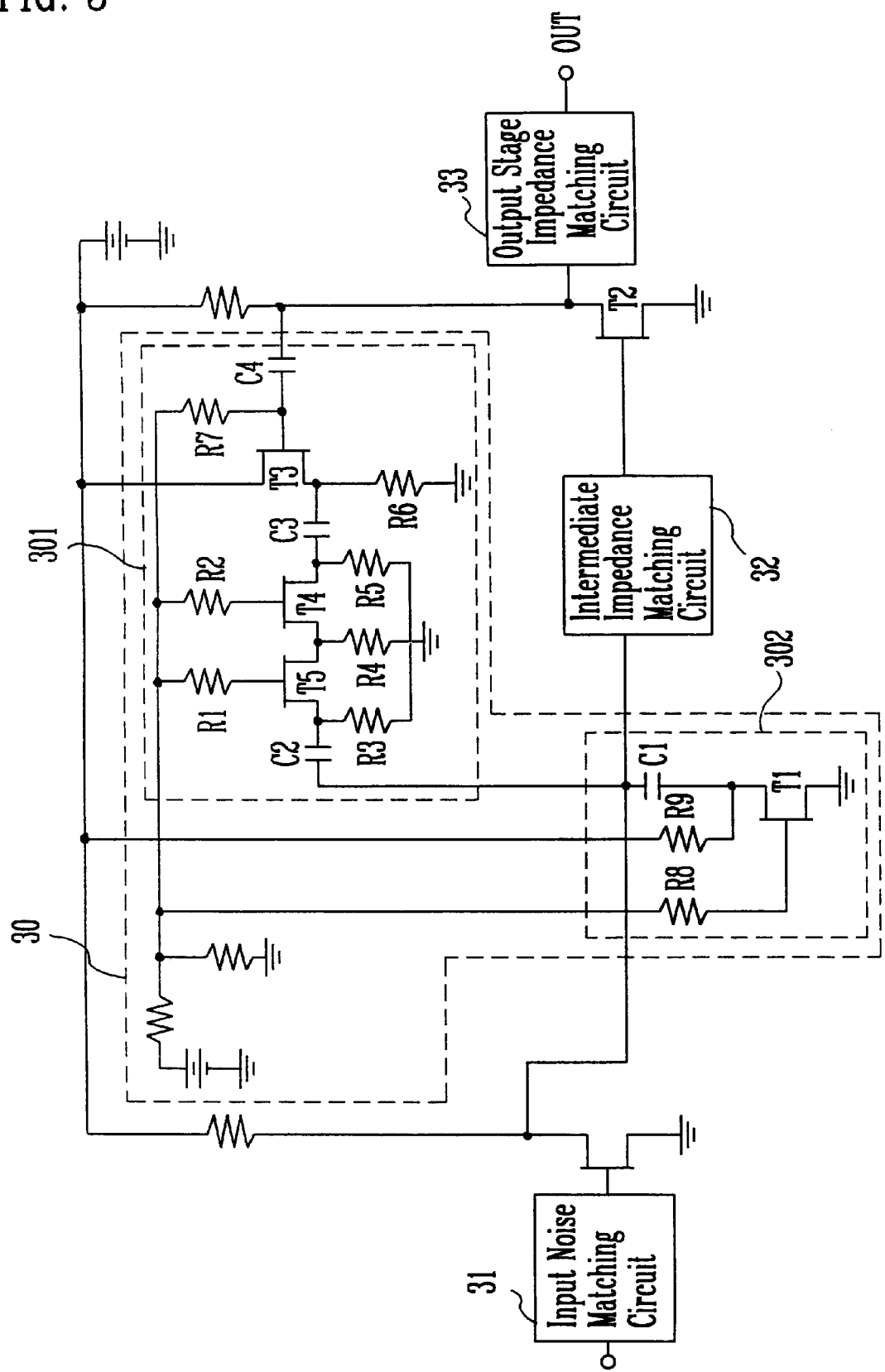
FIG. 3 is a block diagram of the low-noise amplifier having a gain control circuit according to the present invention.

FIG. 3 is a block diagram of the low-noise amplifier having a gain control circuit according to the present invention. The amplifier comprises a 2-stage amplifier, and a gain controller 30 having a feedback circuit 301 and a attenuation circuit 302.

The 2-stage amplifier is comprised of an input stage noise matching circuit 31, an intermediate impedance matching circuit 32 and an output stage impedance matching circuit 33. The feedback circuit 301 comprises a common drain circuit and a switch. The common drain circuit is composed of C4, FET T3, R6, and R7. It is connected to the drain of the FET T2 of the second stage, and detects the amplified signal through the first and second stages and feeds it back through the switch circuit. The switch circuit is composed of FET T4, FET T5, C2, C3, R1, R2, R3, R4, and R5. The attenuation circuit 302 is composed of FET T1, C1, R8, and R9 and it compensates the harmonics.

Figure 4:
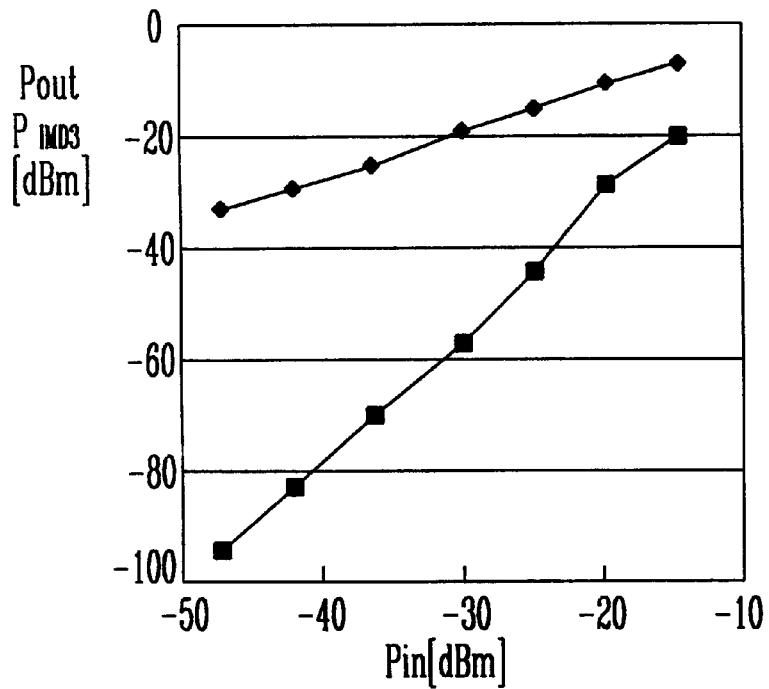
FIG. 4 is a graph showing changes of the 3rd-order intermodulation component according to the variations of input power.

In general, the linearity of an amplifier is good when the strength of the signal is low, but it deteriorates abruptly as the strength becomes higher. This characteristic is shown in FIG. 4. FIG. 4 is a graph showing changes of the 3rd-order intermodulation component according to the variations of input power. When input power is low, the magnitude of the 3rd-order intermodulation component is low resulting in good linearity. As input power increases, however, the output power of the basic component increases in proportion to power of 1 whereas the 3rd-order intermodulation component increases abruptly in proportion to power of 3, resulting in deteriorated linearity.

To solve this problem, in the present invention, the control voltage is lowered at low signal strength, disabling the feedback circuit 301 in FIG. 3 and the attenuation circuit 302 in FIG. 3, thereby increasing gain of the amplifier. As the signal strength becomes higher, the gain control voltage also increases, enabling the operation of the feedback circuit 301 in FIG. 3 and the attenuation circuit 302 in FIG. 3, thereby improving the linearity of the circuit.

Figure 5:
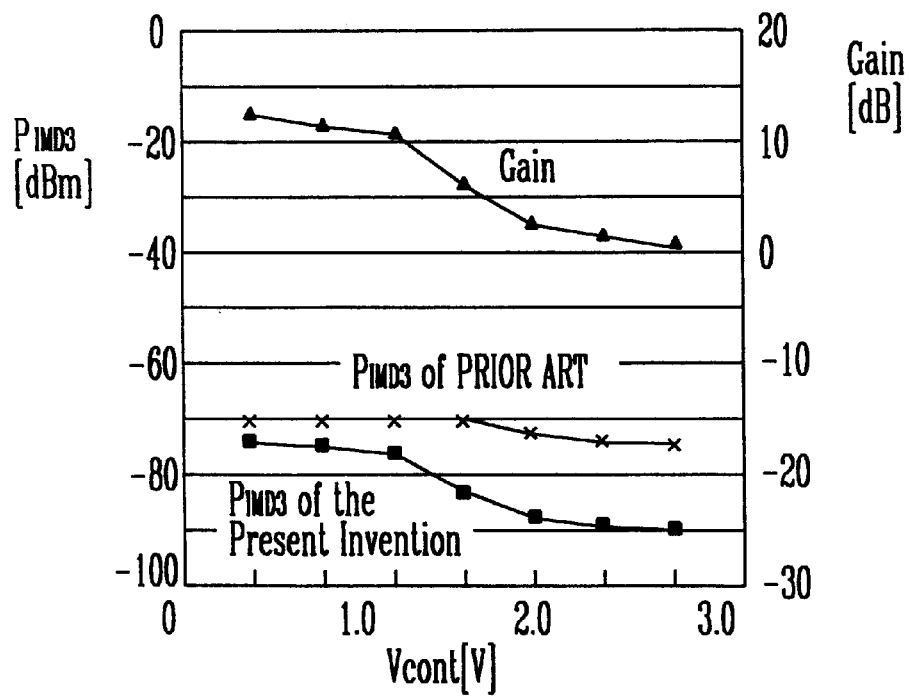
FIG. 5 is a graph showing changes of gain to the variations of the control voltage and characteristics of the 3rd-order intermodulation component.

FIG. 5 is a graph showing changes of gain to the variations of the control voltage and characteristics of the 3rd-order intermodulation component. It shows the variations of the gain characteristics and improvement of the characteristics of the 3rd-order intermodulation component which is a measure of linearity, in relation to the variations of the control voltage when the input power is −40 dBm and the frequency is 1.8 GHz. If the control voltage is increased from 0 V to 3.0 V, the gain decreases from 13 dB to 1 dB so that the input stage mixer which is connected to the next stage is prevented from saturating. For 3 V increase of the control voltage, 16 dB improvement of the 3rd-order intermodulation characteristics can be achieved compared to the prior art circuit.

As described above, according to the present invention, by increasing gain when the input signal strength is low and by decreasing gain when the input signal strength becomes higher, when the control voltage is increased from 0 V to 3.0 V, the gain decreases from 13 dB to 1 dB so control of 12 dB range can be made possible and it is possible to prevent the input stage mixer which is connected to the next stage from saturating. Further, 16 dB improvement of the 3rd-order intermodulation characteristics which is a measure of linearity can be achieved compared to the prior art circuit.

What is claimed is:

1. A gain control circuit of a 2-stage low-noise amplifier comprising an input stage noise matching circuit, an intermediate impedance matching circuit, a gain control circuit, and an output stage impedance matching circuit, said gain control circuit including:
 a feedback circuit for detecting the amplified signal through the first stage and the second stage, and feeding the signal back through a switch circuit, said feedback circuit is connected to a transistor of second stage of the 2-stage low-noise amplifier and comprises a common drain circuit and a switch circuit; and
 an attenuation circuit for compensating the harmonics of the input signal.

* * * * *